(12) United States Patent
Chang et al.

(10) Patent No.: US 12,300,693 B2
(45) Date of Patent: *May 13, 2025

(54) INTEGRATED CIRCUIT WITH FAULT REPORTING STRUCTURE

(71) Applicant: Monolithic Power Systems, Inc., San Jose, CA (US)

(72) Inventors: Chiahsin Chang, Cupertino, CA (US); Tao Zhao, San Jose, CA (US); Xintong Lyu, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/416,633

(22) Filed: Jan. 18, 2024

(65) Prior Publication Data

US 2024/0170479 A1    May 23, 2024

Related U.S. Application Data

(63) Continuation of application No. 17/487,162, filed on Sep. 28, 2021, now Pat. No. 11,916,064.

(51) Int. Cl.
   *H01L 27/02*    (2006.01)
   *H01L 23/525*   (2006.01)

(52) U.S. Cl.
   CPC ........ *H01L 27/0292* (2013.01); *H01L 23/525* (2013.01)

(58) Field of Classification Search
   CPC ............... H01L 27/0292; H01L 23/525; H01L 23/5252; H01L 27/0288; H01L 23/481; H01L 23/544; H03K 17/18; H03K 17/687
   See application file for complete search history.

(56) References Cited

U.S. PATENT DOCUMENTS

| | | | |
|---|---|---|---|
| 6,424,028 B1 * | 7/2002 | Dickinson | H01L 24/49 257/692 |
| 7,808,222 B2 | 10/2010 | Ueunten | |
| 9,780,640 B2 | 10/2017 | Nguyen et al. | |
| 2005/0218959 A1 * | 10/2005 | Yamawaki | H01L 24/06 327/334 |
| 2008/0272658 A1 * | 11/2008 | Kojori | H03K 17/0406 307/131 |
| 2009/0096511 A1 * | 4/2009 | Ueunten | H03K 17/122 327/543 |
| 2010/0164507 A1 * | 7/2010 | Kuenemund | G01R 31/31816 324/537 |
| 2014/0218097 A1 * | 8/2014 | Barrenscheen | H03K 17/18 327/379 |
| 2014/0239381 A1 * | 8/2014 | Tanno | H01L 29/66484 438/282 |
| 2017/0146592 A1 * | 5/2017 | Freeman | G01R 31/2858 |
| 2017/0170714 A1 * | 6/2017 | Nguyen | H02M 3/1584 |
| 2017/0192049 A1 * | 7/2017 | Tavernier | G01R 31/3008 |
| 2021/0063468 A1 * | 3/2021 | Gunasekaran | G01R 31/3277 |

(Continued)

*Primary Examiner* — S M Sohel Imtiaz
(74) *Attorney, Agent, or Firm* — Perkins Coie LLP

(57) ABSTRACT

An integrated circuit with a fault reporting structure. The fault reporting structure includes a first fault reporting structure formed in at least one metal layer of the integrated circuit and electrically coupled to a first fault reporting pin of the integrated circuit. The first fault reporting structure may be adapted to report whether burnt point forms in the integrated circuit.

31 Claims, 7 Drawing Sheets

(56) References Cited

U.S. PATENT DOCUMENTS

| | | | |
|---|---|---|---|
| 2021/0293874 A1* | 9/2021 | Kwon | H02H 1/0007 |
| 2022/0200590 A1* | 6/2022 | Ramond | H03K 17/0822 |
| 2023/0099928 A1 | 3/2023 | Chang et al. | |
| 2023/0283266 A1* | 9/2023 | Higuchi | H02M 1/0006 |
| | | | 326/38 |
| 2023/0327662 A1* | 10/2023 | Kikuchi | H03K 19/007 |
| | | | 307/130 |

\* cited by examiner

INTEGRATED CIRCUIT WITH FAULT REPORTING STRUCTURE

CROSS-REFERENCE TO RELATED APPLICATIONS

The present application claims priority as a continuation to U.S. patent application Ser. No. 17/487,162, filed on Sep. 28, 2021.

TECHNICAL FIELD

The present invention generally relates to electronic circuits, and more particularly but not exclusively to integrated circuits and a fault reporting structure thereof.

BACKGROUND

In power solutions of highly integrated applications, a fault reporting structure is usually comprised in an integrated circuit for reporting a fault event. However, on some occasions, when a catastrophic failure occurs in which case an area of the integrated circuit is burnt (for example, due to an electrical overstress) or in other words, a burnt point forms in the integrated circuit, the fault event cannot be reported. For example, the fault reporting function may be accomplished with a fault reporting pin and an open-drain MOSFET coupled together, and a fault signal is provided to indicate the fault occurrence when the open-drain MOSFET is pulled up to a bias voltage VDD. However, the bias voltage VDD or even the open-drain MOSFET itself may be destroyed and the fault event thus cannot be reported.

Thus, an approach at least addressing the above-mentioned issue is desired.

SUMMARY

Embodiments of the present invention are directed to a fault reporting structure of an integrated circuit having at least one power MOSFET, wherein the at least one power MOSFET has a plurality of MOSFET cells with each MOSFET cell having a drain metal and a source metal, wherein the integrated circuit has a power MOSFET area for routing the drain metals and the source metals of the plurality of MOSFET cells, the fault reporting structure comprising: a metal net routed in the power MOSFET area or in an area above or below the power MOSFET area; and a fault reporting pin coupled to the metal net and configured to provide a fault signal indicating whether the integrated circuit is in a normal status or in a fault status.

Embodiments of the present invention are further directed to an integrated circuit, comprising: a first fault reporting structure comprising a first fault reporting pin configured to provide a first fault signal indicating whether the integrated circuit is in a first fault status; and a second fault reporting structure comprising a second fault reporting pin configured to provide a second fault signal indicating whether the integrated circuit is in a second fault status.

Embodiments of the present invention are further directed to a fault reporting structure of an integrated circuit, wherein the integrated circuit having at least one metal layer, the fault reporting structure comprising: a metal net embedded in the at least one metal layer; and a fault reporting pin coupled to the metal net and configured to provide a fault signal indicating whether the integrated circuit is in a normal status or in a fault status; wherein the metal net is floating inside the integrated circuit when the integrated circuit is in normal operation.

BRIEF DESCRIPTION OF THE DRAWINGS

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Embodiments of the present invention are directed to a multi-phase switching converter comprising a plurality of switching circuits. During normal operation, all of the switching circuits are turned on successively. When an over current condition of a current switching circuit of the plurality of switching circuits is detected, instead of shutting down the whole multi-phase switching converter, the current switching circuit is skipped and the other switching circuits are turned on successively. In this specification, multi-phase switching converters with constant on-time control are set as examples to describe the embodiments. However, persons skilled in the art can recognize that the present invention can also be applied to multi-phase switching converters with any other control method.

Figure 1:
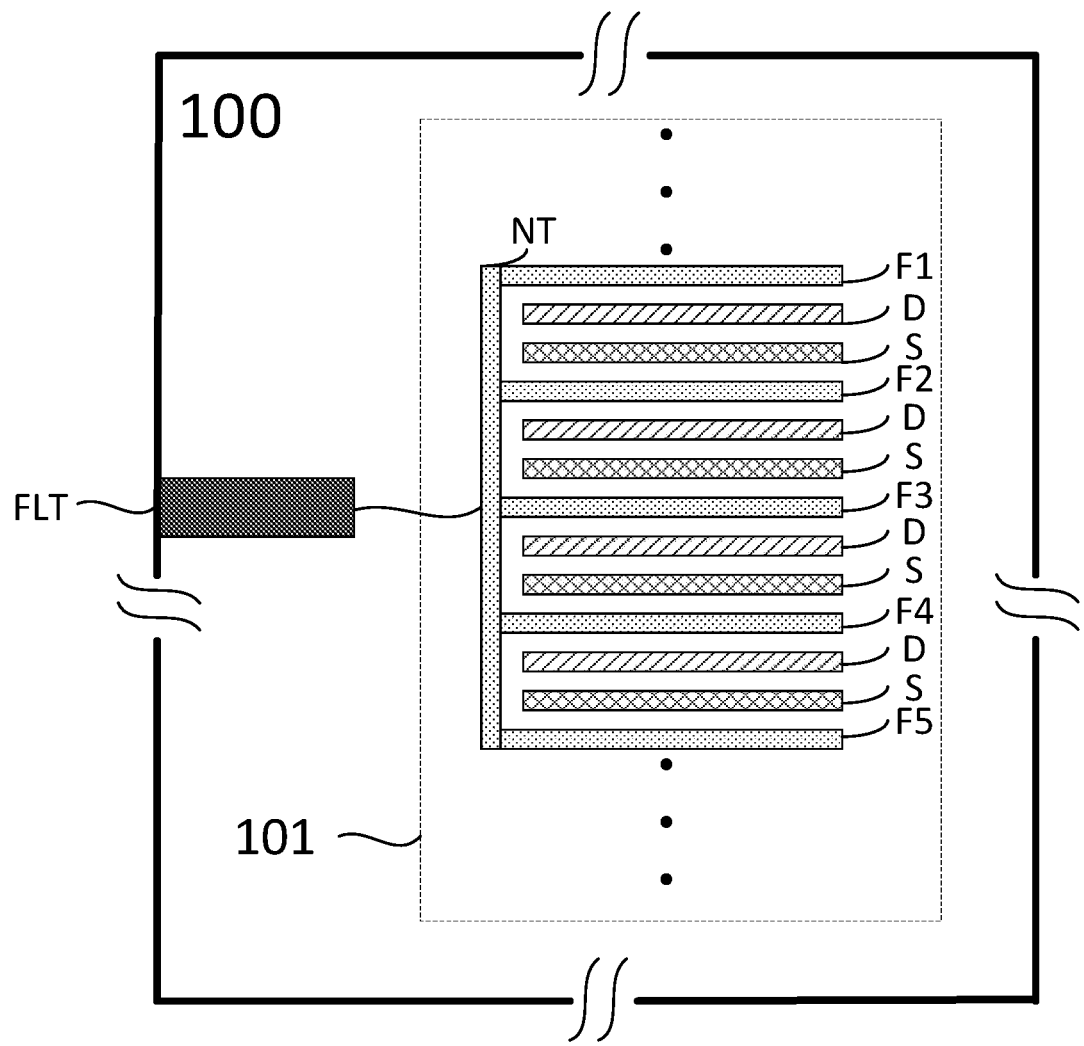
FIG. 1 illustrates a top plan view of a portion of an integrated circuit 100 in accordance with an embodiment of the present invention.

FIG. 1 illustrates a top plan view of a portion of an integrated circuit 100 in accordance with an embodiment of the present invention. The integrated circuit 100 comprises at least one power MOSFET (Metal Oxide Semiconductor Field Effect Transistor), and the least one power MOSFET comprises a plurality of MOSFET cells with each MOSFET cell having a drain metal D and a source metal S. Persons of ordinary skill in the art will recognize that, for the purpose of clarity, only a portion of each of the plurality of MOSFET cells is shown in FIG. 1.

Persons of ordinary skill in the art will recognize that, the at least one power MOSFET of the integrated circuit 100 may comprise one, two, four or any number of power MOSFETs, depending on the topology and the specific design of the integrated circuit 100. For example, in an embodiment where the integrated circuit 100 comprises a DrMOS (driver MOSFET) integrated circuit having a synchronous buck converter topology, the at least one power MOSFET may comprise a high-side power MOSFET for receiving an input voltage, and the at least one power MOSFET may further comprise a low-side power MOSFET coupled to a power ground.

Persons of ordinary skill in the art will recognize that, in an embodiment, the power MOSFET of the present invention may refer to a specific type of MOSFETs which are capable of handling a significant current level (e.g., Ampere), compared with the other MOSFETs with much lower current handling capability (e.g., a level of microampere or milliampere).

Figure 2:
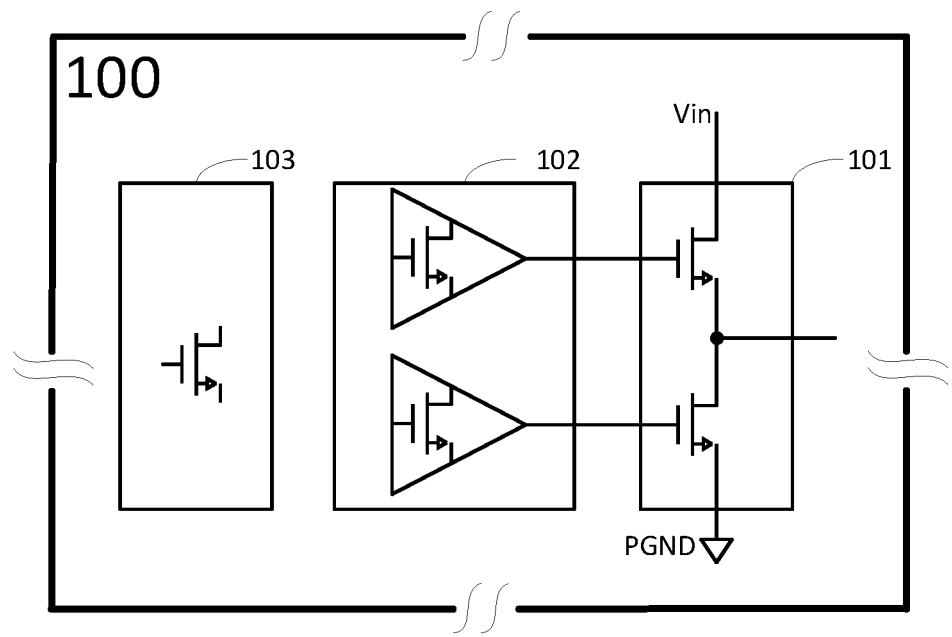
FIG. 2 illustrates an exemplary block diagram of the integrated circuit 100 of FIG. 1 in accordance with an embodiment of the present invention.

FIG. 2 illustrates an exemplary block diagram of the integrated circuit 100 of FIG. 1 in accordance with an embodiment of the present invention. As illustrated in FIG. 2, the integrated circuit 100 may comprise an output stage 101 comprising at least one MOSFET coupled to an input voltage Vin or a power ground PGND, a driving stage 102 for driving the at least one MOSFET of the output stage 101 and a controlling circuit 103. In such the embodiment, the power MOSFET of the present invention may refer to the at least one MOSFET of the output stage 101, while the other MOSFETs may refer to the MOSFETs of the controlling circuit 103 and/or the MOSFETs of the driving stage 102.

Further, in an embodiment, the integrated circuit 100 of FIG. 2 may comprise a DrMOS integrated circuit having a synchronous buck converter topology and the output stage 101 may comprise a high-side MOSFET and a low-side MOSFET. Both the high-side MOSFET and the low-side MOSFET have a first terminal, a second terminal and a control terminal, wherein the first terminal of the high-side MOSFET is configured to receive the input voltage Vin, the first terminal of the low-side MOSFET is coupled to the second terminal of the high-side MOSFET, and the second terminal of the low-side MOSFET is coupled to the power ground PGND. The control terminals of the high-side MOSFET and of the low-side MOSFET are driven by the driving stage 102. In such the embodiment, the power MOSFETs of the present invention may refer to the high-side MOSFET and/or the low-side MOSFET of the output stage 101 of the DrMOS integrated circuit, while the other MOSFETs may refer to the MOSFETs of the controlling circuit 103 and the MOSFETs of the driving stage 102 of the DrMOS integrated circuit.

In the integrated circuit 100 of FIG. 1, in an embodiment, the drain metal D may be routed in a plurality of metal layers of the integrated circuit 100. And the portions of the drain metal D routed in different metal layers may be coupled by via(s) and/or other conductive coupling structure(s). In further an embodiment, the plurality of metal layers may comprise a RDL layer (redistribution layer) and/or a UBM layer (under bump metallization layer) and the drain metal D may comprise portion(s) routed in the RDL layer and/or in the UBM layer. Similarly, in an embodiment, the source metal S may be routed in a plurality of metal layers of the integrated circuit 100. And the portions of the source metal S routed in different metal layers of the integrated circuit 100 may be coupled by via(s) and/or other conductive coupling structure(s). In further an embodiment, the source metal S may comprise portion(s) routed in the RDL layer and/or in the UBM layer.

With continuing reference to FIG. 1, the integrated circuit 100 comprises a power MOSFET area for routing the drain metals and the source metals of the plurality of MOSFET cells. In an embodiment, the power MOSFET area may refer to a portion of a larger area for routing all the power MOSFETs of the integrated circuit 100. In another embodiment where the drain metal D and the source metal S of each of the plurality of MOSFET cells are routed in a plurality of metal layers, the power MOSFET area may refer to the area of one single metal layer of the plurality of metal layers for routing the corresponding portion of the drain metals and the source metals of the plurality of MOSFET cells.

Figure 3:
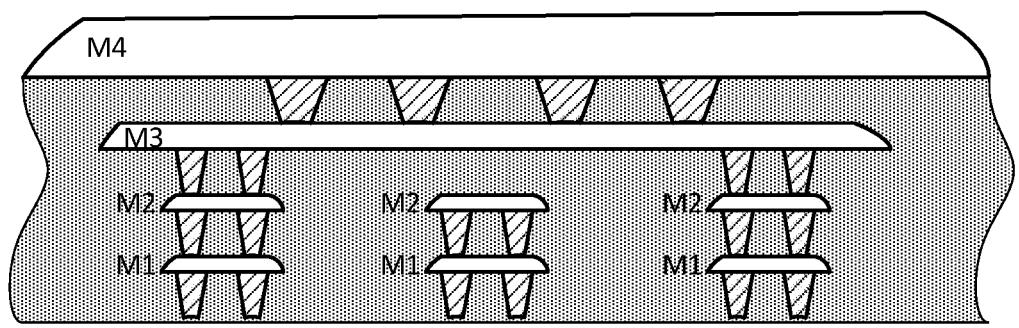
FIG. 3 illustrates a cross-sectional view of a portion of an exemplary layout of the integrated circuit 100 with a plurality of metal layers in accordance with an embodiment of the present invention.

FIG. 3 illustrates a cross-sectional view of a portion of an exemplary layout of the integrated circuit 100 of FIG. 1 with a plurality of metal layers in accordance with an embodiment of the present invention. As shown in FIG. 3, the integrated circuit 100 comprises a plurality of metal layers M1, M2, M3 and M4, wherein the metal layer M4 is a RDL layer. The drain metals and the source metals of the plurality of MOSFET cells are routed in the plurality of metal layers M1, M2, M3 and M4. The portions of the drain metals and of the source metals in the metal layers M1, M2, M3 and M4 are coupled through via(s). In such the embodiment, the power MOSFET area may refer to the area of the metal layers M1, M2, M3 or M4 for routing the corresponding portions of the drain metals and of the source metals of the plurality of MOSFET cells.

Figure 4:
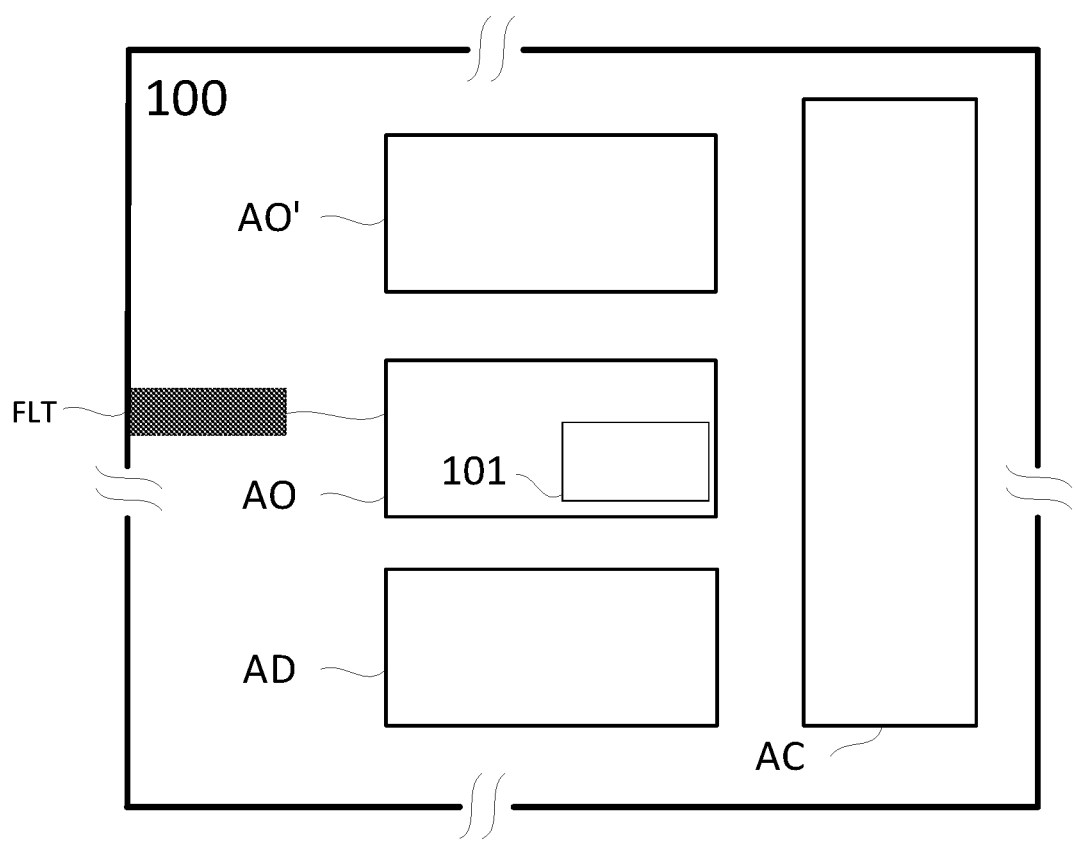
FIG. 4 illustrates an exemplary layout of a portion of the integrated circuit 100 of FIG. 2 in accordance with an embodiment of the present invention.

In an embodiment, in the integrated circuit 100 of FIG. 2, the power MOSFET area routs the drain metals and the source metals of the plurality of MOSFET cells of the at least one power MOSFET of the output stage 101 but does not rout the drain metals and the source metals of the MOSFETs of the control circuit 103 or of the driving stage 102 of the integrated circuit 100. FIG. 4 illustrates an exemplary layout of a portion of the integrated circuit 100 of FIG. 2 in accordance with an embodiment of the present invention. As shown in FIG. 4, the integrated circuit 100 comprises a first area AD for routing the driving stage 102, a second area AC for routing the controlling circuit 103, and a third area AO for routing the output stage 101. In such the embodiment, the power MOSFET area refers to the third area AO or a portion of the third area AO.

In further an embodiment, the integrated circuit 100 of FIG. 4 may further comprise other area(s) for routing the output stage 101 or other portions of the integrated circuit 100. For example, in the embodiment where the integrated circuit 100 comprises a DrMOS integrated circuit having a synchronous buck converter topology, the integrated circuit 100 may have the third area AO for routing the high-side MOSFET and a fourth area AO' for routing the low-side MOSFET. Persons of ordinary skill in the art will recognize that the layout of the integrated circuit 100 of FIG. 4 is only for illustration, the areas AD, AC, AO, and/or AO' may be arranged differently, depending on the specific design of the integrated circuit 100.

With continuing reference to FIG. 1, the integrated circuit 100 comprises a fault reporting structure, and the fault reporting structure comprises a metal net NT and a fault reporting pin FLT. The metal net NT is routed in the power MOSFET area. The fault reporting pin FLT is coupled to the metal net NT and is configured to provide a fault signal SFLT indicating whether the integrated circuit 100 is in a normal status or in a fault status. In an embodiment, the fault reporting pin FLT is coupled to the metal net NT through any one or the combination of via(s), bump(s) and any other conductive coupling structure(s). In another embodiment, the fault status indicates of a catastrophic failure of the integrated circuit 100 in which case an area of the integrated circuit 100 is burnt (e.g., due to an electrical overstress) or in other words, a burnt point forms in the integrated circuit 100. In other words, the fault status indicates of the catastrophic failure of the integrated circuit 100 that the integrated circuit 100 is burnt. In yet another embodiment, the metal net NT is electrically isolated from the drain metals and the source metals of the plurality of MOSFET cells of the at least one power MOSFET.

In another embodiment, the metal net NT may be routed in an area above or below the power MOSFET area. In further an embodiment, the metal net NT may be routed in an area over or under the power MOSFET area. Still yet, in another embodiment, the metal net NT may be routed in separate metal layer(s) which only routes the metal net NT.

Figure 5:
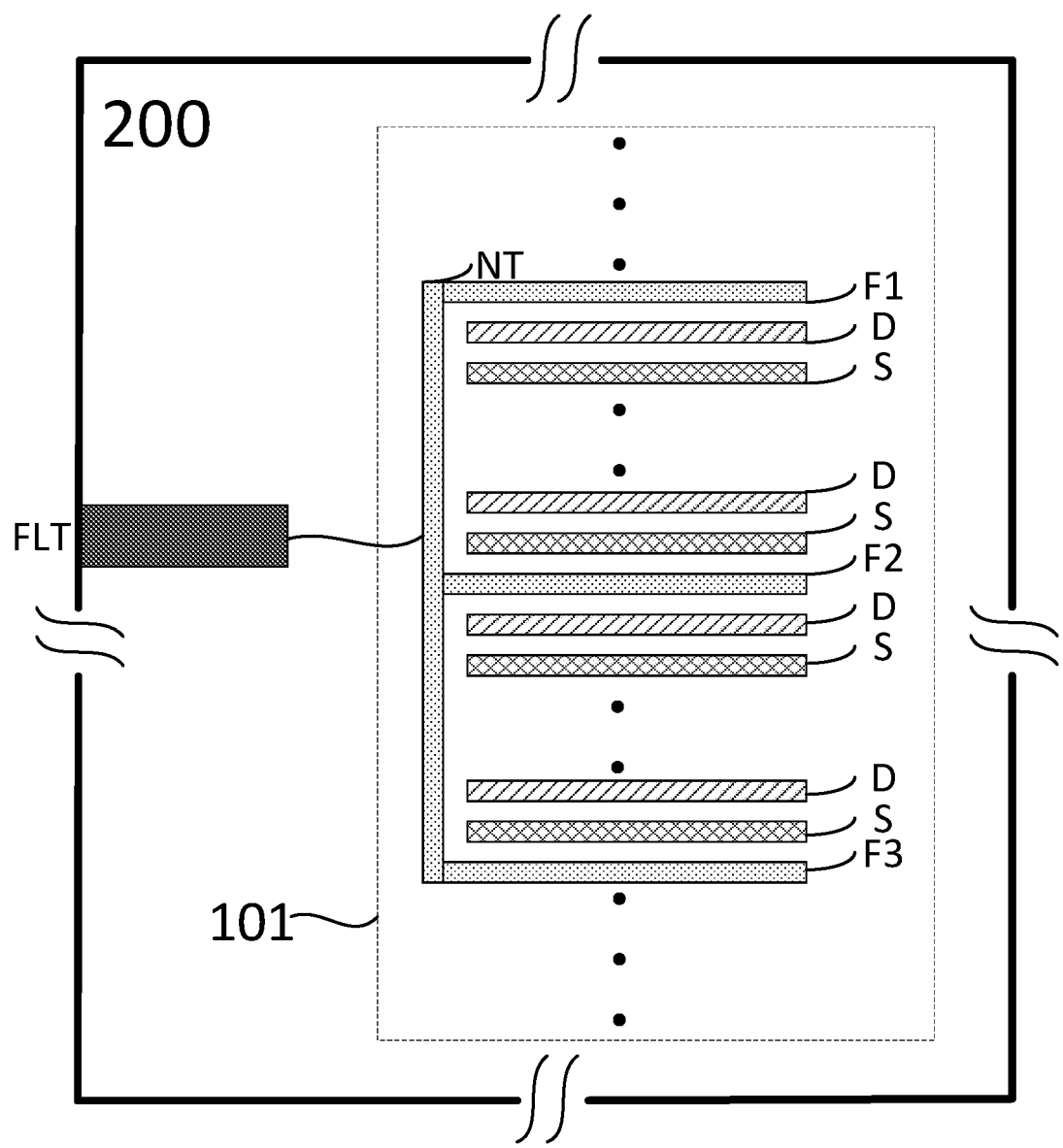
FIG. 5 illustrates a top plan view of a portion of layout of an integrated circuit 200 in accordance with an embodiment of the present invention.

In the integrated circuit 100 shown in FIG. 1, the metal net NT has a finger-shaped structure having a plurality of fingers F1, . . . , F5 in parallel with the drain metals and the source metals of the plurality of MOSFET cells. In FIG. 1, a finger is routed every one pair of drain metal and source metal. In another embodiment, a finger may be routed every two or more pairs of drain metal and source metal as shown in FIG. 5.

Figure 6:
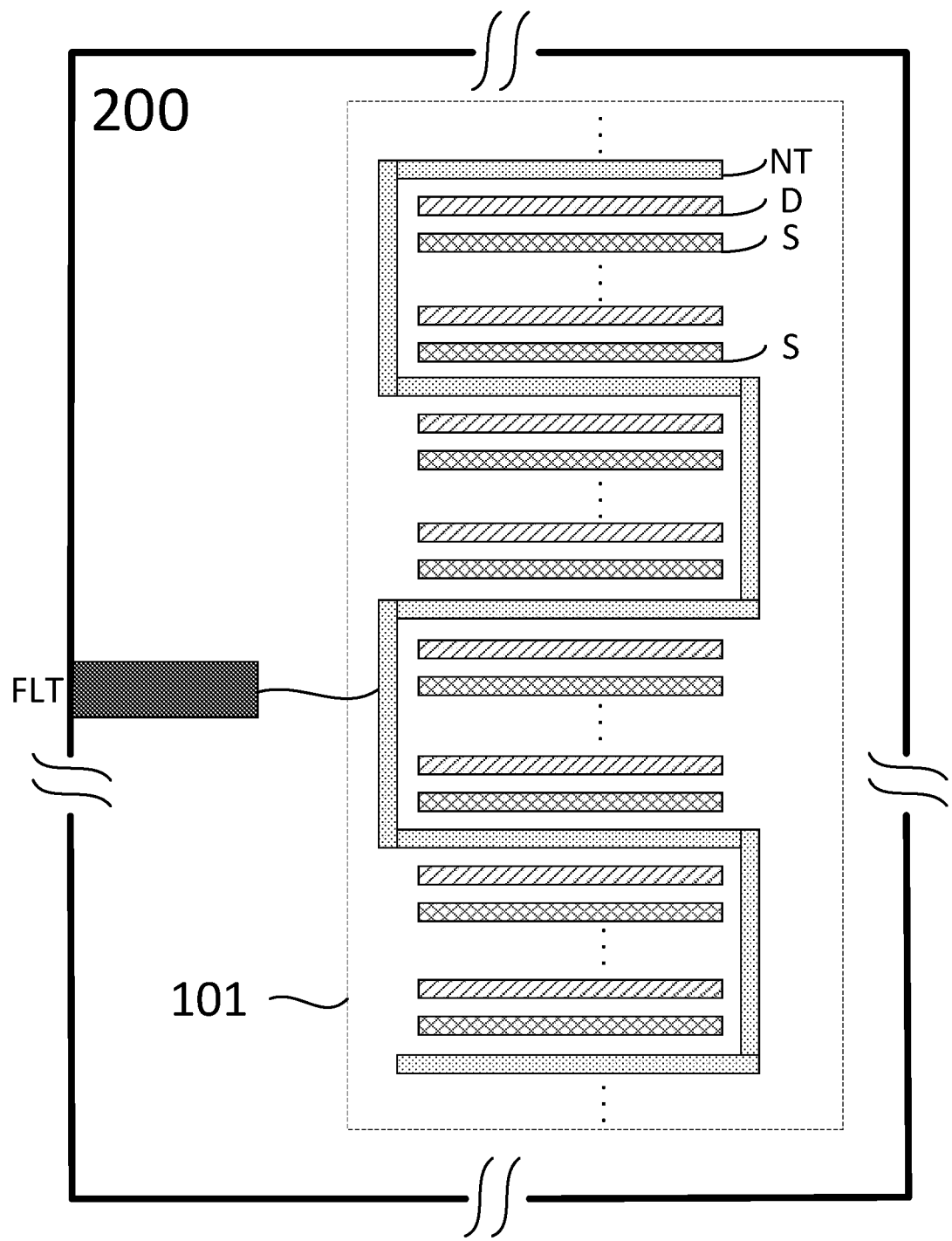
FIG. 6 illustrates an exemplary layout of a portion of the integrated circuit 200 of FIG. 2 in accordance with an embodiment of the present invention.

FIG. 6 illustrates a top plan view of a portion of layout of an integrated circuit 200 in accordance with an embodiment of the present invention. In the integrated circuit 200, the metal net NT has a snake-shaped structure and the metal net NT may be connected to the fault reporting pin FLT at anywhere of the metal net NT depending on the demand of the design. In another embodiment, the metal net NT may have a grid shape.

Persons of ordinary skill in the art will recognize that, FIG. 1 and FIG. 6 illustrate exemplary shapes of the metal net NT, but of course, other shapes of the metal net NT are contemplated as long as the metal net NT has such a structure that at least a part of the metal net NT is burnt and the metal net NT is electrically shorted to ground when a burnt point forms in the integrated circuit 100.

With the fault reporting structure of the present invention, when the integrated circuit 100 is in operation, the fault reporting pin FLT of the integrated circuit 100 is externally coupled to a fault detecting pin of a controlling integrated circuit so as to report the status of the integrated circuit 100 through the fault signal SFLT. The controlling integrated circuit sources a current through the fault detecting pin to an impedance inherently formed between the fault reporting pin FLT and a ground. When the integrated circuit 100 is in a normal status, the voltage at the fault reporting pin FLT will be at a high level as the current flows into the impedance; while when the integrated circuit 100 is in a fault status, a burnt point forms in the integrated circuit 100, at least a portion of the metal net NT of the fault reporting structure will also be burnt and the metal net NT is thus shorted to ground, and as a result, the voltage at the fault reporting pin FLT is at a low level. In this way, the fault reporting structure of the present invention can report whether the integrated circuit 100 is in a normal status or in a fault status.

Figure 7:
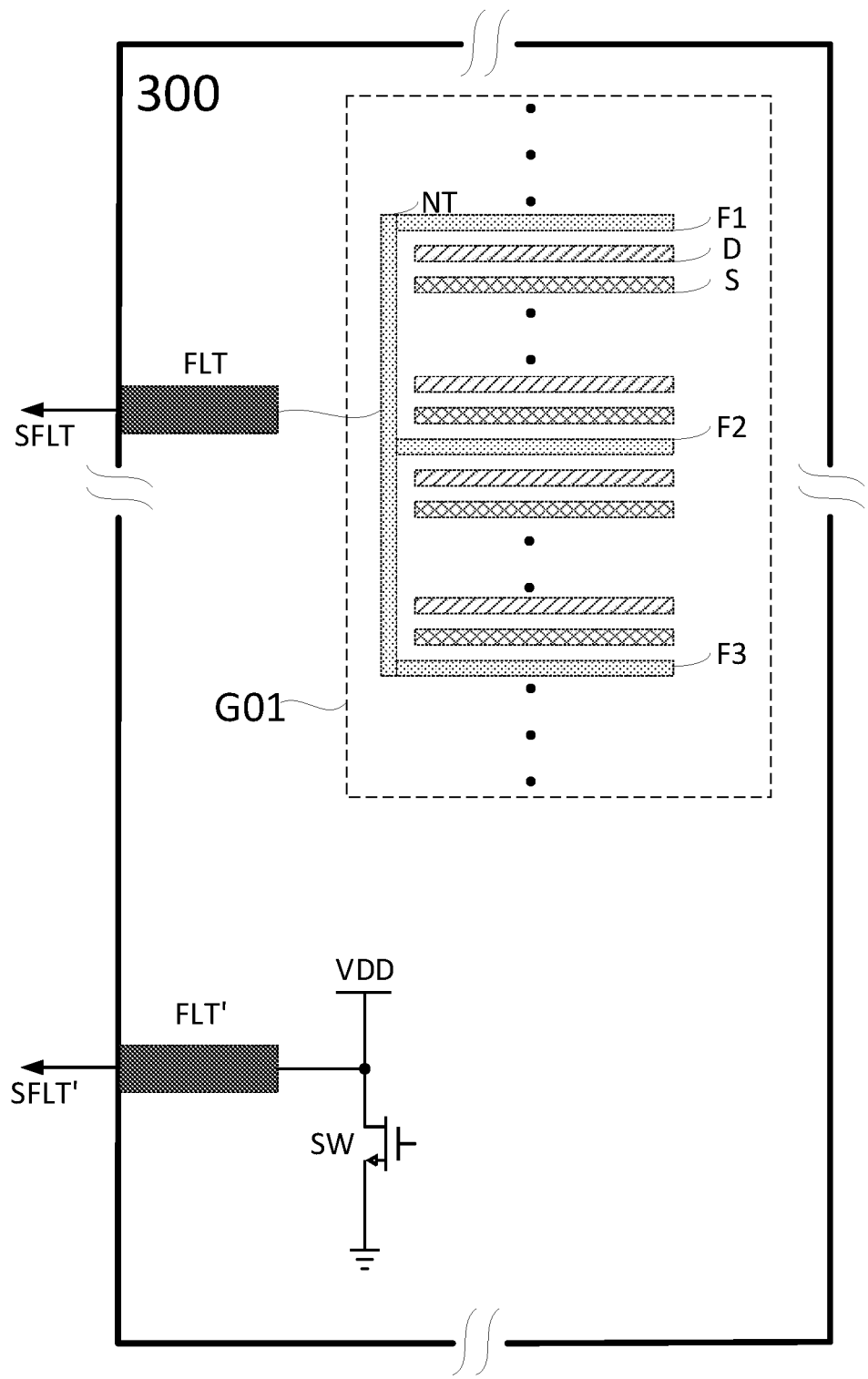
FIG. 7 illustrates another integrated circuit 300 in accordance with an embodiment of the present invention.

FIG. 7 illustrates another integrated circuit 300 in accordance with an embodiment of the present invention. As shown in FIG. 7, the integrated circuit 300 comprises a first fault reporting structure comprising a first fault reporting pin FLT configured to provide a first fault signal SFLT indicating whether the integrated circuit 300 is in a first fault status. And the integrated circuit 300 further comprises a second fault reporting structure comprising a second fault reporting pin FLT' configured to provide a second fault signal SFLT' indicating whether the integrated circuit 300 is in a second fault status.

In an embodiment, the first fault status indicates of a catastrophic failure of the integrated circuit 300 that a burnt point forms in the integrated circuit 300. In other words, the first fault status indicates of the catastrophic failure that the integrated circuit 300 is burnt. And the second fault status indicates that an over current event, an over voltage event or an over temperature event occurs in the integrated circuit 300. In an embodiment, the second fault status may indicate any one of the over current event, the over voltage event or the over temperature event. Yet in another embodiment, the second fault status may indicate all of the over current event, the over voltage event and the over temperature event.

As shown in FIG. 7, the first fault reporting structure further comprises a metal net NT which is embedded in a metal layer of the integrated circuit 300 and the first reporting pin FLT is coupled to the metal net NT. Persons of ordinary skill in the art will recognize that the metal net NT in the embodiment of FIG. 7 may be implemented with the metal net NT described in any of the embodiments of the present invention, and for the purpose of clarity, they are not repeated herein. Further, the second fault reporting structure may further comprise a switch SW having a first terminal and a second terminal, and the second fault reporting pin FLT' is coupled to the first terminal of the switch SW. In further an embodiment, the switch SW is a MOSFET having a drain metal coupled to the first terminal and a source metal coupled to the second terminal. In another embodiment, the first terminal is coupled to a bias voltage VDD and the second terminal is coupled to a signal ground SGND. In an embodiment, the second fault signal SFLT' is in a high level when the integrated circuit 300 is in the second fault status and is in a low level when the integrated circuit 300 is not in the second fault status. In another embodiment, the second fault signal SFLT' is in a low level when the integrated circuit 300 is in the second fault status and is in a high level when the integrated circuit 300 is not in the second fault status. In an embodiment, the metal net NT is electrically isolated from the first terminal and the second terminal of the switch SW.

In an embodiment, the integrated circuit 300 is a DrMOS (driver MOS) integrated circuit as described in the above embodiments of the present invention.

With the first fault reporting structure and the second fault reporting structure of the present invention, the integrated circuit 300 of the present invention can not only report the second fault status, such as an over current status, an over voltage status or an over temperature status, but also the first fault status that a burnt point forms in the integrated circuit 300. Especially, when the second fault reporting structure is realized by an open-drain MOSFET with its drain metal being coupled to the second fault reporting pin as well as the bias voltage VDD and the second fault signal is in a high level when the integrated circuit 300 is in the second fault status, the second fault reporting structure cannot be used to report the catastrophic failure when the bias voltage VDD is shorted to ground or the open-drain MOSFET is destroyed due to the burnt point. With this first fault reporting structure of the present invention, the catastrophic failure can be reported anyhow.

Figure 8:
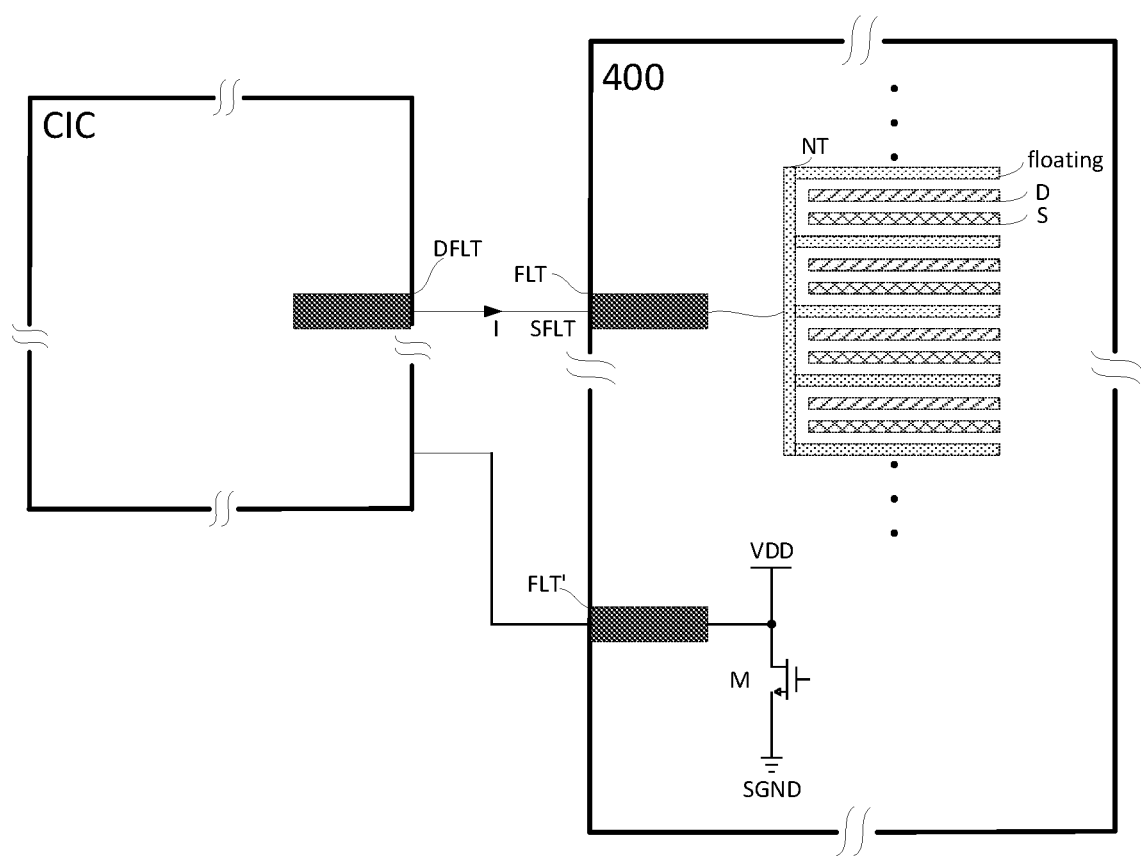
FIG. 8 illustrates an integrated circuit 400 in accordance with an embodiment of the present invention.

FIG. 8 illustrates an integrated circuit 400 in accordance with an embodiment of the present invention. The integrated circuit 400 comprises at least one metal layer and a fault reporting structure. The fault reporting structure of the integrated circuit 400 comprises a metal net NT embedded in the at least one metal layer, wherein the metal net NT is floating inside the integrated circuit 400 when the integrated circuit 400 is in normal operation. The integrated circuit 400 further comprises a fault reporting pin FLT coupled to the metal net NT and configured to provide a fault signal SFLT indicating whether the integrated circuit 400 is in a normal status or in a fault status.

Persons of ordinary skill in the art will recognize that, when saying "the metal net NT is floating inside the integrated circuit 400", it means that the metal net NT is not coupled to any voltage level inside the integrated circuit 400. As illustrated in FIG. 8, in an embodiment, the fault reporting pin FLT is externally coupled to a fault detecting pin DFLT of a controlling integrated circuit CIC configured to control the integrated circuit 400 for providing the fault signal SFLT. In such the embodiment, the controlling integrated circuit CIC provides a current I through the fault detecting pin DFLT to the fault reporting pin FLT of the integrated circuit 400 and the metal net NT is thus coupled to a voltage level at the fault reporting pin FLT. In this situation, the metal net NT is still considered as floating inside the integrated circuit 400 as the metal net NT is not coupled to any voltage level inside the integrated circuit 400 although the metal net NT is coupled to the voltage level at the fault reporting pin FLT as the external current I flowing into the fault reporting pin FLT. In an embodiment, the fault detecting pin of the controlling integrated circuit CIC is a general purpose input/output pin which can be used for general-purpose analog voltage sensing.

As shown in FIG. 8, the integrated circuit 400 may further comprise an MOSFET M having a drain metal and a source metal, and wherein the drain metal of the MOSFET M is coupled to another fault reporting pin FLT' for reporting another fault status of the integrated circuit 400 and a bias voltage VDD, and the source metal of the MOSFET M is coupled to a signal ground SGND. The another fault reporting pin FLT' is also coupled to the controlling integrated circuit CIC for reporting the another fault status. Comparing the metal net NT with the MOSFET M, we can see that the metal net NT is floating inside the integrated circuit 400 while the MOSFET M is not floating inside the integrated circuit 400 as the MOSFET M is coupled the bias voltage VDD inside the integrated circuit 400.

Obviously many modifications and variations of the present invention are possible in light of the above teachings. It is therefore to be understood that within the scope of the appended claims the invention may be practiced otherwise than as specifically described. It should be understood, of course, that the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

The invention claimed is:

1. A fault reporting structure of an integrated circuit having at least one power MOSFET at a power MOSFET area, the fault reporting structure comprising:
   a metal net routed in the power MOSFET area or in an area above or below the power MOSFET area; and
   a fault reporting pin coupled to the metal net and adapted to be configured to report whether the integrated circuit is in a normal status or in a fault status.

2. The fault reporting structure of claim 1, wherein the metal net is electrically isolated from a plurality of drain metals and source metals of the at least one power MOSFET.

3. The fault reporting structure of claim 1, the metal net comprises a finger-shaped structure having a plurality of finger metals.

4. The fault reporting structure of claim 1, the metal net comprises a snake-shaped structure or a grid shaped structure.

5. The fault reporting structure of claim 1, wherein when a burnt point forms in the integrated circuit, the metal net has at least a portion burnt and the metal net is electrically shorted to ground.

6. The fault reporting structure of claim 1, wherein the integrated circuit comprises a plurality of metal layers, and wherein the at least one power MOSFET has drain metals and source metals routed in the plurality of metal layers, and wherein the power MOSFET area refers to an area of one single metal layer of the plurality of metal layers for routing corresponding portions of the drain metals and the source metals of the at least one power MOSFET.

7. The fault reporting structure of claim 1, wherein the power MOSFET area is a portion of a larger area for routing all the power MOSFETs of the integrated circuit.

8. The fault reporting structure of claim 1, wherein the integrated circuit further comprises:
   a second fault reporting pin; and
   a fault reporting MOSFET having a drain metal and a source metal, and wherein the drain metal of the fault reporting MOSFET is coupled to the second fault reporting pin and the source metal of the fault reporting MOSFET is coupled to a signal ground.

9. The fault reporting structure of claim 1, wherein the integrated circuit further comprises:
   a fault reporting MOSFET, adapted to be configured to report another fault status of the integrated circuit, wherein the fault reporting MOSFET has a drain metal coupled to a bias voltage and a source metal coupled to a signal ground.

10. The fault reporting structure of claim 9, wherein the source metal and the drain metal of the fault reporting MOSFET are not routed in the power MOSFET area.

11. A fault reporting structure of an integrated circuit, comprising:
    a metal net; and
    a fault reporting pin, coupled to the metal net and adapted to be configured to report a fault status of the integrated circuit.

12. The fault reporting structure of claim 11, wherein the metal net comprises a finger-shaped structure having a plurality of finger metals.

13. The fault reporting structure of claim 11, the metal net comprises a snake-shaped structure or a grid shaped structure.

14. The fault reporting structure of claim 11, wherein the fault status is indicative of a catastrophic failure that a burnt point forms in the integrated circuit.

15. The fault reporting structure of claim 11, wherein the metal net is electrically shorted to ground at the fault status.

16. The fault reporting structure of claim 11, wherein the metal net is electrically floating inside the integrated circuit when the fault status is not occurred in the integrated circuit.

17. The fault reporting structure of claim 11, further comprising:
a switch, having a first terminal coupled to a bias voltage and a second terminal coupled to a signal ground.

18. An integrated circuit having at least one metal layer, comprising:
a first fault reporting pin, adapted to be configured to report a first fault status of the integrated circuit; and
a first fault reporting structure, formed in the at least one metal layer of the integrated circuit and electrically coupled to the first fault reporting pin.

19. The integrated circuit of claim 18, wherein the first fault reporting structure comprises a metal net embedded in the at least one metal layer of the integrated circuit.

20. The integrated circuit of claim 18, wherein the first fault status indicates that a burnt point forms in the integrated circuit.

21. The integrated circuit of claim 18, further comprising:
a second fault reporting pin, adapted to be configured to report a second fault status of the integrated circuit; and
a second fault reporting structure, electrically coupled to the second fault reporting pin.

22. The integrated circuit of claim 21, wherein the second fault reporting structure comprises a switch having a first terminal coupled to the second fault reporting pin and a second terminal coupled to a signal ground.

23. The integrated circuit of claim 22, wherein the first terminal of the switch is further coupled to a bias voltage.

24. The integrated circuit of claim 21, wherein the second fault reporting structure is electrically isolated from the first fault reporting structure.

25. The integrated circuit of claim 21, wherein the second fault status indicates that an over current event, or an over voltage event or an over temperature event occurs in the integrated circuit.

26. A fault reporting structure of an integrated circuit having at least one metal layer, comprising:
a first fault reporting structure, formed in the at least one metal layer of the integrated circuit and electrically coupled to a first fault reporting pin of the integrated circuit.

27. The fault reporting structure of claim 26, wherein the first fault reporting structure is electrically floating inside the integrated circuit when no burnt point forms in the integrated circuit.

28. The fault reporting structure of claim 26, wherein the fault reporting pin is adapted to be externally coupled to a controlling integrated circuit configured to control the integrated circuit.

29. The fault reporting structure of claim 26, wherein the fault reporting pin is adapted to be configured to receive a current.

30. The fault reporting structure of claim 26, further comprising a second fault reporting structure electrically coupled to a second fault reporting pin of the integrated circuit.

31. The fault reporting structure of claim 30, wherein the second fault reporting structure comprises a switch having a first terminal coupled to the second fault reporting pin and a second terminal coupled to a signal ground.

* * * * *